US007236741B2

(12) United States Patent
Palermo et al.

(10) Patent No.: US 7,236,741 B2
(45) Date of Patent: *Jun. 26, 2007

(54) METHODS AND APPARATUS FOR TUNING IN AN INDUCTIVE SYSTEM

(75) Inventors: Vincent Palermo, Westford, MA (US); Domenic F. Terranova, North Andover, MA (US)

(73) Assignee: Aura Communications Technology, Inc., Wilmington, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/373,456

(22) Filed: Mar. 10, 2006

(65) Prior Publication Data

US 2006/0154615 A1    Jul. 13, 2006

Related U.S. Application Data

(63) Continuation of application No. 10/978,515, filed on Nov. 1, 2004, now Pat. No. 7,035,608, which is a continuation-in-part of application No. 10/004,989, filed on Dec. 3, 2001, which is a continuation-in-part of application No. 09/942,372, filed on Aug. 29, 2001, now abandoned.

(60) Provisional application No. 60/556,328, filed on Mar. 25, 2004, provisional application No. 60/296,229, filed on Jun. 6, 2001, provisional application No. 60/276,398, filed on Mar. 16, 2001.

(51) Int. Cl.
*H04B 5/00* (2006.01)
*H04B 7/00* (2006.01)
*H04B 1/40* (2006.01)
*H04B 1/44* (2006.01)
*H04B 1/18* (2006.01)
*H01Q 11/12* (2006.01)

(52) U.S. Cl. .............. 455/41.1; 455/41.2; 455/77; 455/78; 455/120; 455/169.1

(58) Field of Classification Search ...... 455/41.1–41.3, 455/418, 550.1, 76–78, 86–88, 562.1, 569.1, 455/575.2, 575.6, 575.7, 95, 103, 120–121, 455/178.1, 180.4, 185.1, 186.1, 197.2, 191.1–191.2, 455/11.1, 82, 66.1, 101, 73–74, 125–126, 455/133–136, 192.3, 193.1, 195.1, 170.1, 455/274, 556.1, 169.1–169.2, 107, 129; 340/854.4, 340/854.8, 870.31, 870.32, 448, 941, 538.16, 340/854.6, 855.4, 855.7; 379/443, 55.1; 334/4, 17–18, 40–41
See application file for complete search history.

(56) References Cited

U.S. PATENT DOCUMENTS 3,801,799 A    4/1974  Atkins ................... 307/116

(Continued)

FOREIGN PATENT DOCUMENTS

WO    WO 96/37052    * 11/1996

OTHER PUBLICATIONS

Notification of Transmittal of the International Search Report and the Written Opinion of the International Searching Authority, or the Declaration, Aug. 30, 2005.

*Primary Examiner*—Meless N. Zewdu
(74) *Attorney, Agent, or Firm*—Chapin IP Law, LLC; Paul P. Kriz, Esq.

(57) ABSTRACT

Electronic circuitry supports utilization of a series of pulses of varying width to tune a transducer (e.g., a coil that produces or receives a magnetic field) for transmitting or receiving. For example, a control voltage generator generates a sequence of digital pulses of varying pulse widths to produce respective control voltages. The control voltage generator applies a produced control voltage to a varactor element whose capacitance changes depending on a magnitude of the produced control voltage. The varactor element forms part of a tank circuit. Consequently, the series of pulse widths controls an operating frequency of the tank circuit at different times. The tank circuit includes an inductive coil that is tuned to produce or receive a magnetic or inductive field.

16 Claims, 4 Drawing Sheets

U.S. PATENT DOCUMENTS

| | | | |
|---|---|---|---|
| 3,803,495 A | 4/1974 | Reynolds | 455/166.2 |
| 3,916,335 A * | 10/1975 | Masson | 331/4 |
| 4,008,429 A | 2/1977 | Phalan | 323/17 |
| 4,531,117 A * | 7/1985 | Nourse et al. | 340/572 |
| 4,562,411 A * | 12/1985 | O'Rourke et al. | 331/1 A |
| RE32,686 E * | 5/1988 | Dages | 455/182 |
| 5,392,001 A | 2/1995 | Uhling et al. | 330/156 |
| 5,589,844 A | 12/1996 | Belcher et al. | 343/860 |
| 5,701,121 A * | 12/1997 | Murdoch | 340/825.54 |
| 5,889,437 A * | 3/1999 | Lee | 331/17 |
| 5,969,439 A | 10/1999 | Johannessen | 307/106 |
| 6,323,739 B1 * | 11/2001 | Andrews | 331/117 R |
| 6,362,789 B1 | 3/2002 | Trumbull et al. | 343/700 MS |
| 6,417,675 B1 | 7/2002 | Johnson | 324/601 |
| 6,424,820 B1 * | 7/2002 | Burdick et al. | 455/41.1 |
| 6,459,882 B1 | 10/2002 | Palermo et al. | 455/41.1 |
| 6,621,410 B1 | 9/2003 | Lastinger et al. | 340/10.42 |
| 6,812,802 B1 * | 11/2004 | Godambe et al. | 331/183 |
| 6,888,504 B2 | 5/2005 | Chiang et al. | 343/702 |
| 6,963,307 B2 * | 11/2005 | Mohamadi | 343/700 |
| 7,035,608 B2 * | 4/2006 | Palermo et al. | 455/193.1 |
| 2002/0062132 A1 | 5/2002 | Kramer et al. | 606/169 |
| 2002/0160722 A1 | 10/2002 | Terranova et al. | 455/73 |
| 2003/0219035 A1 * | 11/2003 | Schmidt | 370/478 |

* cited by examiner

METHODS AND APPARATUS FOR TUNING IN AN INDUCTIVE SYSTEM

RELATED APPLICATIONS

This application is a Continuation of earlier filed U.S. patent application Ser. No. 10/978,515 entitled "METHODS AND APPARATUS FOR TUNING IN AN INDUCTIVE SYSTEM," filed on Nov. 1, 2004 now U.S. Pat. No. 7,035,608; which itself is a Continuation-In-Part (CIP) of earlier filed U.S. patent application Ser. No. 10/004,989 entitled "Wireless Communication Over a Transducer Device," filed on Dec. 3, 2001; which itself is a Continuation-In-Part (CIP) earlier filed U.S. patent application Ser. No. 09/942,372 entitled "Wireless Communication Over a Transducer Device," filed on Aug. 29, 2001 now abandoned; both of which claim the benefit of earlier filed U.S. Provisional Patent Application Ser. No. 60/296,229 entitled "System and Method for Wireless Communication," filed on Jun. 6, 2001, and earlier filed U.S. Provisional Patent Application Ser. No. 60/276,398 entitled "Techniques for a Wireless Communication System," filed on Mar. 16, 2001, the entire teachings of all of which are incorporated herein by this reference. This application is also related to and claims the benefit of earlier filed U.S. Provisional Patent Application Ser. No. 60/556,328 entitled "Methods and Apparatus for Streaming Data in an Inductive Communication System," filed on Mar. 25, 2004, the entire teachings of which are incorporated herein by this reference.

BACKGROUND

Inductive antenna devices have been incorporated in transceivers to transmit and receive wireless signals for quite some time. In a typical application, a transceiver device supporting bi-directional communication includes two specifically tuned antennas, one of which is tuned for transmitting while the other is tuned for receiving.

Unlike RF (Radio Frequency) antennas, the transmit and receive paths for inductive antennas or transducer assemblies are often tuned independently of each other for more efficiently transmitting and receiving wireless signals. For example, inductive transducer assemblies used for transmitting respective inductive signals are generally tuned so they effectively have a low impedance. Conversely, inductive transducer assemblies used for receiving are typically tuned so they effectively have a high impedance.

Conventional inductive systems supporting two-way communications include separate coils, one of which is pre-tuned for transmitting an inductive signal and another of which is pre-tuned for receiving at a particular carrier frequency.

SUMMARY

Recent advancements in integrated circuit technology render it possible to reduce the overall size of wireless transceiver devices because semiconductor chips provide yet more and more functionality in smaller packages. Additionally, the size and weight of power sources (e.g., battery devices) for powering corresponding wireless devices has been reduced to support increased portability. Thus, wireless transceiver devices are now smaller than ever before.

Unfortunately, conventional inductive transceiver devices are not yet small enough. Users continue to demand smaller and smaller devices that provide the same or better quality of communication. As a result, the relative size and weight associated with the use of transducers and associated conventional circuitry for transmitting and receiving can be prohibitive due to space restrictions in certain wireless applications.

It would be an advancement in the art to reduce the power, cost, size and weight of a transceiver system (e.g., an inductive communication device) for transmitting and receiving wireless signals based on use of an electronically tunable inductive communication system that reduces or eliminates a need for implementing redundant circuitry, overly complex circuitry, or manually adjusting trim pots or other circuit components.

More specifically, embodiments of the present invention provide a novel and useful way of tuning transducer elements over conventional methods. For example, in one embodiment of the present invention, electronic circuitry supports utilization of a pulse to tune a transducer (e.g., a coil that produces or receives a magnetic field) for transmitting or receiving. In one embodiment, a control circuit generates a digital pulse of variable width to produce a control voltage. This control voltage drives a varactor element whose capacitance changes depending on the magnitude of the produced control voltage. The varactor element forms part of a tank circuit. Consequently, the generation of a pulse of variable width controls an operating frequency of the tank circuit. In one embodiment, the tank circuit includes an inductive element such as a coil that is tuned to produce or receive a magnetic or inductive field. Tuning the tank circuit and, more specifically, the coil by generating a pulse of variable width provides flexibility because a simple, lightweight, and low cost CMOS logic circuit that generates pulses of predetermined widths can be used to tune the coil for transmitting or receiving.

Now more generally, an embodiment of the present application includes a transducer assembly that supports transmission and/or reception of inductive signals (e.g., wireless signals). A control circuit selects a desired operating frequency to tune the transducer assembly. The control circuit couples to or includes a pulse generator circuit. To tune the transducer assembly, the control circuit initiates the pulse generator circuit to produce a pulse of a predetermined width in a control signal to tune the transducer assembly to the desired operating frequency. Thus, a control circuit generating a digital stream of information can be used to dynamically or electronically tune a transducer assembly to a desired operating frequency for unidirectional or bidirectional communications.

In one embodiment, the control circuit tunes a transducer in the transducer assembly to transmit an inductive signal (e.g., a magnetic field) at a first carrier frequency based on initiation of the pulse generator circuit to generate a first pulse of variable width. Following transmission of an inductive signal from the transducer on the first carrier frequency, the control circuit re-tunes the transducer in the transducer assembly to receive an inductive signal on a second carrier frequency based on initiation by the control circuit to generate a pulse of variable width.

As discussed above and according to one embodiment, generation of a pulse of a particular width by the pulse generator causes a control voltage generator to produce a control voltage that tunes a transducer such as an inductive coil in the transducer assembly by means of a voltage controlled capacitor (varactor). The control voltage generator produces larger control voltages for longer pulse widths received from the pulse generator circuit. Consequently, a short pulse width produces a lower voltage while longer pulse widths produce larger control voltage values.

In one embodiment, the control voltage drives a circuit element whose impedance changes depending on an applied voltage. The circuit element can be, for example, a capacitive circuit element such as a varactor element whose capacitance is set based on the applied control or control voltage. In such an embodiment, the varactor forms part of a tank circuit whose operating frequency is set depending on the applied control voltage. Thus, the tank circuit, potentially including a transducer coil to transmit or receive a magnetic field, can be tuned depending on the applied control voltage. A typical application of the embodiments discussed herein involves first tuning the transducer assembly and, thereafter, transmitting or receiving an inductive field.

According to further embodiments, the control circuit includes a reset signal to reset the control voltage generator. Consequently, the control circuit can initially generate the control signal to set the control voltage and tune the transducer assembly to a desired operating frequency. After transmitting or receiving data on the transducer assembly, the control circuit can reset the control voltage to substantially zero volts. The control circuit then initiates the generation of another pulse of a given width to produce another control voltage to tune the transducer assembly to another desired operating frequency. Accordingly, the control circuit can initiate setting the transducer to different desired operating frequencies.

In one embodiment, the control circuit initiates generation of a pulse (e.g., a square wave) in the control signal to produce a control voltage and tune the transducer tank circuit to a first carrier frequency. Thereafter, the control circuit initiates generation of a reset signal to reset the control voltage prior to later re-tuning (e.g., via generation of another pulse) the transducer tank circuit of the transducer assembly to a different carrier frequency.

According to yet a further embodiment, the transducer assembly includes multiple transducer circuits, each of which includes one or more transducers (e.g., coils) to transmit and/or receive magnetic field signals. The control circuit, in addition to initiating generation of the pulses to generate control voltages, selects a given transducer circuit of multiple transducer circuits in the transducer assembly for tuning. For example, the control circuit generates a series of pulses of variable widths at different times (for a digital stream of high and low voltage states) to generate control voltages that, over time, tune each of the selected transducer circuits to a desired operational frequency. Additionally, in one embodiment, the control circuit activates a single tuned transducer circuit in the transducer assembly for transmission and/or reception of inductive signals.

In one embodiment, the control circuit includes associated memory to store calibration information including different pulse widths to be applied to the control voltage generator for tuning a transducer circuit in the transducer assembly to respective different operating frequencies. For example, the control circuit accesses the calibration information in memory to identify the duration of pulses required to tune the transducer assembly to the desired operating frequency.

The memory can store different calibration tables for respectively tuning the transducer assembly depending on whether the control circuit sets the transducer assembly for transmitting or receiving. This is because a control voltage for setting the transducer assembly to a desired operating frequency for transmitting and receiving may not be the same. For example, when in a transmit mode, the control circuit initiates generation of the control voltage to a given value to set the transducer assembly to a first desired operating frequency for transmitting. However, switching the transducer assembly to a receive mode and applying the same control voltage may result in tuning the transducer to receive at an operating frequency different the first operating frequency due to a difference of parasitic impedances in the transducer assembly which vary depending on whether it is set to a transmit mode versus a receive mode. Thus, according to one embodiment, to receive and transmit at the same operating frequency, the control circuit must generate two different pulse widths to produce two different respective control voltages so that the same transducer (e.g., wire coil) in the transducer assembly can both transmit and receive at the same operating frequency.

Accordingly, one embodiment of the transducer assembly discussed above includes a tank circuit whose parasitic impedances change depending on whether the transducer assembly is set to a transmit mode versus a receive mode. As previously discussed, the tank circuit can include a respective inductive element supporting transmission and/or reception of inductive signals.

Use of the pulses to reconfigure a transducer assembly to a desired operating frequency for transmitting and receiving requires fewer circuit components than conventional applications. For example, conventional methods employ two separate inductive coils, one tuned for transmitting and another tuned for receiving. This requires excess circuit board space and adds unnecessary weight to the transducer assembly. Use of techniques discussed herein enable transmission and reception on the same transducer without a significant delay between setting a corresponding operational mode of the transducer assembly.

According to one embodiment, the control circuit maintains calibration information based on prior test circuit measurements. For example, in a test mode, the control circuit tunes the transducer assembly through a range of settings via application of pulses of different widths while receiving a known test magnetic field signal. Based on which applied pulse width (or setting) produces a strongest received signal for the received test magnetic field, the control circuit stores this derived calibration information in memory for later use. A similar calibration routine can be used to calibrate the transducer assembly for transmitting. For example, the transducer assembly can be tuned based on applying a range of pulse widths to identify settings of the transducer assembly for a transmit mode. Consequently, based on the above calibration testing, the control circuit associated with the transducer assembly can identify respective operating frequencies of a transducer circuit in the transducer assembly for the different applied pulse widths.

Embodiments of the invention are well-suited for use in shorter-range wireless applications such as those that support inductive or magnetic coupling, but the broader general concepts discussed herein can be extended to other applications as well.

Other embodiments of the invention include a processor device (e.g., the control circuit) configured to support the aforementioned method operations disclosed herein as embodiments of the invention to configure a transducer assembly. In such embodiments, the processing device has an associated memory system and an interconnect. The interconnect supports communications between the processor and the memory system. The memory system is encoded with a control management application that, when executed on the processor device, produces a control process. The control process initiates tuning and re-tuning of the transducer assembly and corresponding one or multiple transducers for transceiving (e.g., transmitting or receiving) magnetic fields.

Yet other embodiments of the invention disclosed herein include software programs to perform the method embodiment and operations summarized above and disclosed in detail under the heading Detailed Description below. More particularly, certain embodiments of the invention include a computer program product (e.g., a computer-readable medium) including computer program logic encoded thereon that may be executed on a processor device to perform the operations (e.g., the methods) as discussed herein. Thus, embodiments of the invention include software or computer code. Other arrangements of the invention include hardware such as analog/digital circuit devices to perform the techniques discussed herein.

One embodiment of the invention is directed to a computer program product that includes a computer readable medium having instructions stored thereon for supporting tuning of a transducer assembly. The instructions, when carried out by a processor, enable the processor to perform the steps of: i) identifying a desired operating frequency and a specific transducer to tune in the transducer assembly, ii) initiating generation of a pulse in a control signal to tune the selected transducer in the transducer assembly to the desired operating frequency, and iii) utilizing the tuned transducer in the transducer assembly for at least one of transmission and reception of inductive signals.

Yet another embodiment of the invention is directed to a technique of: i) coupling one of multiple transducers to a circuit to transmit or receive a magnetic field; ii) selecting a frequency for communicating via the magnetic field; iii) via use of a varactor device, sweeping through a range of impedance values to identify which of multiple values is optimal for transmitting or receiving over the coupled one of multiple transducers at the selected frequency; and iv) storing an identified optimal impedance value for later use.

BRIEF DESCRIPTION OF THE DRAWINGS

The foregoing and other objects, features and advantages of the invention will be apparent from the following more particular description of embodiments of the invention, as illustrated in the accompanying drawings and figures in which like reference characters refer to the same parts throughout the different views. The drawings are not necessarily to scale, emphasis instead being placed upon illustrating the embodiments, principles and concepts of the invention.

DETAILED DESCRIPTION

In one embodiment of the invention, electronic circuitry supports utilization of pulses to tune a transducer assembly (e.g., one or more coils that produce or receive a magnetic field) for transmitting or receiving. For example, an embodiment of the invention includes generating pulses of different widths to produce different control voltages. A produced control voltage drives a variable capacitor (e.g., a varactor element) whose capacitance changes depending on a magnitude of the produced control voltage. The variable capacitor forms part of a tank circuit. Consequently, the pulse of variable width controls an operating frequency of the tank circuit. Further, the tank circuit includes a transducer such as an inductive coil that is tuned to transmit or receive a magnetic or inductive field. Tuning the tank circuit and, more specifically, the coil by generating a pulse of variable width enables fast electronic tuning via a simple electronic circuit that generates the pulses.

Figure 1:
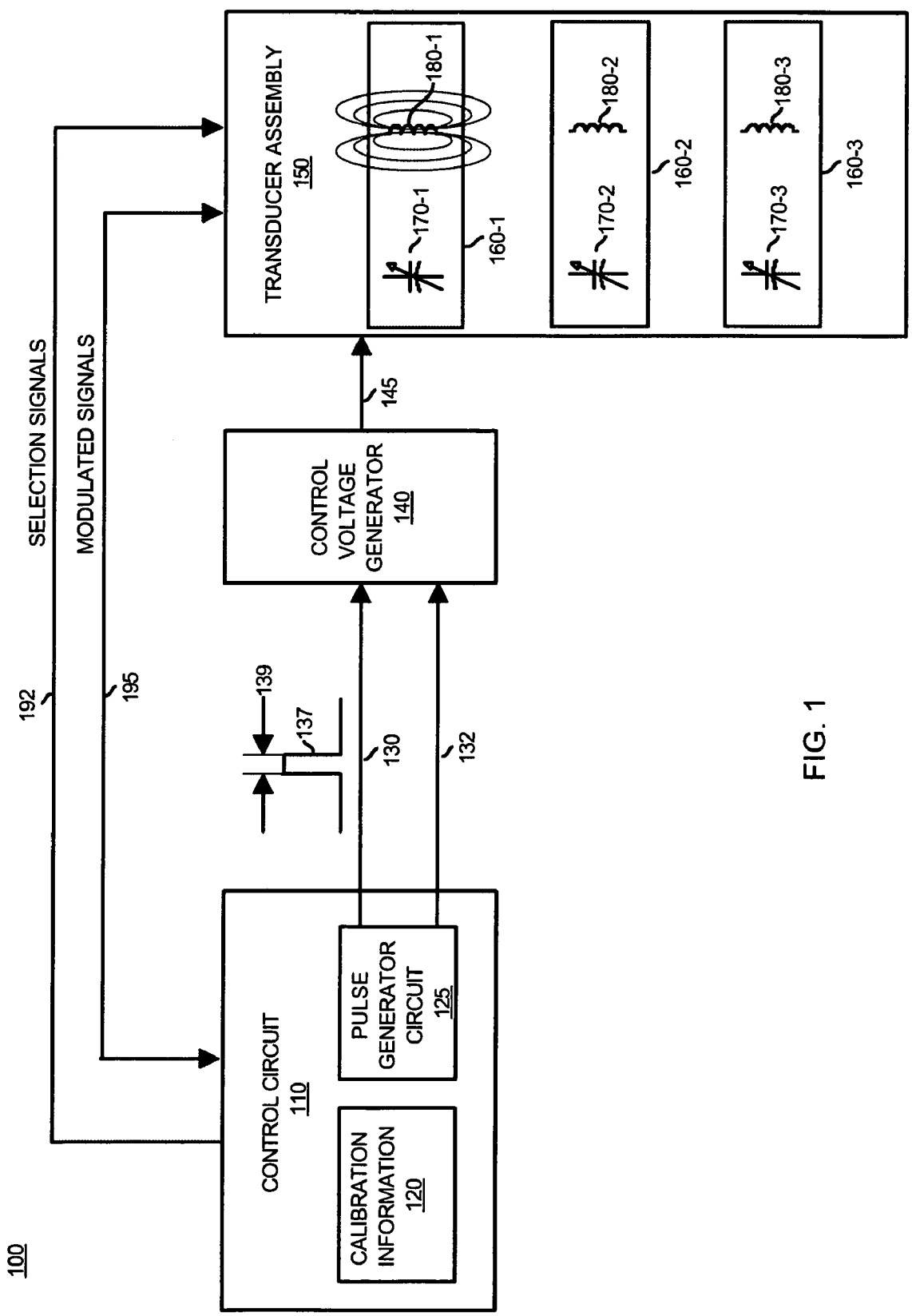
FIG. 1 is a diagram illustrating a technique of tuning a transducer assembly according to an embodiment of the invention.

FIG. 1 is a block diagram of a communication system 100 including circuitry for tuning a transducer assembly 150 according to an embodiment of the invention. As shown, communication system 100 includes control circuit 110 (e.g., a processor device), corresponding calibration information 120 (e.g., stored in memory), pulse generator circuit 125, control voltage generator 140, and transducer assembly 150. Pulse generator circuit 125 produces a control signal 130 and reset signal 132 as initiated by control circuit 110. Based on the control signal 130 and reset signal 132, control voltage generator 140 produces a control voltage 145 applied to transducer circuits 160-1, 160-2, and 160-3. Each transducer circuit 160 includes a respective capacitive element 170 such as a varactor device whose capacitance changes depending on applied control voltage 145. Additionally, each transducer circuit includes a respective transducer 180 such as a coil for transmitting and/or receiving inductive signals.

Note that transducer assembly 150 can include one or more transducer circuits 160 (and respective transducers 180 such as inductive coils that transmit and receive magnetic fields) depending on the application. Also, in one embodiment, transducers 180-1, 180-2, and 180-3 are positioned in different orientations such as on respective a X-axis, Y-axis, and Z-axis for transmitting and receiving inductive signals from different angles. In one embodiment, transducer assembly 150 is optionally portable so that its orientation is not fixed with respect to a target transceiver with which it communicates. Use of transducers on each of an X, Y and Z axis ensures that transducer assembly 150 may communicate with another inductive transceiver device having as few as a single transducer coil to communicate. Additional details concerning communication techniques and possible circuit configurations can be found co-pending U.S. patent application Ser. No. 10/004,989 filed on Dec. 3, 2001, entitled "Wireless Communications Over a Transducer Device," the entire teachings of which are incorporated herein by this reference.

In one embodiment, a respective capacitive element 170 and transducer 180 form part of a tank circuit (e.g., LC circuit) in a transducer circuit 160. Application of the control voltage 145 tunes the tank circuit and, more particularly, a respective transducer 180 for transmitting or receiving magnetic field signals (a.k.a., inductive signals).

As discussed above, embodiments of the present invention provide a novel and useful way of tuning transducers 180 for transmitting or receiving data from a remote device over a wireless link. For example, electronic circuitry supports utilization of a of a pulse to tune a transducer 180 (e.g., a coil that produces or receives a magnetic field) for transmitting or receiving. More specifically, an embodiment of the invention includes generating a duration 139 of a pulse 137 to produce a control voltage 145. In one embodiment, an example pulse has a width of 25 microseconds and repeating once every 10 milleseconds. The pulse width and repetition rate can change depending on the application. In one embodiment, operating frequencies of the transducers range from 10 to 15 MHz.

Another aspect of the present invention concerns selecting of components disposed in either the transmit or receive circuit. Although any component values generally can be selected for use in communication system 100, component values are typically selected to provide a desired performance. In space-restricted applications, an actual size of components is a factor to consider for selecting component values. Typically, capacitor values are on the order of nanofarads or picofarads. In other applications, power dissipation and signal bandwidth are factors to consider for properly selecting component values. Thus, selection of components can differ depending on a particular application.

Although 13 MHz is a typical operating frequency for transmitting and/or receiving in one application, a selected carrier frequency can be any suitable setting such as between 0.5 and 60 MHz or even outside this range.

One application of the invention relates to changing the operating frequency of the transducer assembly 150. In the event that other wireless devices are utilizing a similar carrier frequency as transducer assembly 150, interference typically can be avoided during operational use in the field by dynamically tuning a transmitter/receiver of the transducer assembly 150 to transmit and receive at another carrier frequency.

The control voltage 145 generated by control voltage generator 140 provides a bias to capacitive elements 170 such as varactor devices whose capacitance changes depending on a magnitude of the control voltage 145. The capacitive elements 170 form part of a respective transducer circuit 160 (e.g., a tank circuit) in transducer assembly 150. Consequently, the generation of a pulse width 139 controls an operating frequency of the transducer circuit 160.

In one embodiment, each transducer circuit 160 includes a respective transducer 180 such as a coil that is tuned to produce or receive a magnetic or inductive field.

Tuning the transducer circuit 160 and, more specifically, the transducer 180 by generating a duration 139 of a pulse 137 provides flexibility because a simple control circuit 110 or pulse generator circuit 125 that generates a pulse or series of pulses over time can be used to tune the coil for transmitting or receiving. For example, a control circuit 110 or pulse generator circuit 125 generating a digital stream of information (e.g., logic ones and zeros) can be used to dynamically or electronically tune a transducer 180 in transducer assembly 150 to a desired operating frequency for unidirectional or bidirectional communications. A simple pair of logic signals from the control circuit 110 is easily achievable using two pins on a standard CMOS Application Specific Integrated Circuit (ASIC). It would be quite difficult to generate the control voltage directly on the ASIC since voltages exceeding 30 volts may be required. This is typically not practical using standard CMOS integrated circuit processes.

As discussed, transducers 180 can be inductive devices for generating a wireless signal such as a magnetic field. In such an application, transducer 180 can be a coiled strand of wire. A magnetic field can be generated when a current is driven through the coiled wire. A ferrite rod can be disposed at a core of the coiled strand of wire to enhance directional or signal strength characteristics of transducer 180 for receiving and transmitting a magnetic field. In a specific application, transducer 113 includes a 4×8 mm (millimeters) ferrite rod having four turns of wire. However, specific attributes of transducers 180 can vary depending on a particular application.

In one application, the control circuit 110 and pulse generator circuit 125 are part of a CMOS-based ASIC device that operates at under 3 volts DC. Tuning of the transducer circuits 160 may require higher voltages such as 30 volts DC or higher. In such an application, pulse generator circuit 125 produces a stream of digital pulse widths 137 between 0 and 3 volts. Depending on a duration 139 of the pulse within the stream 137, control voltage generator 140 provides a step-up voltage function to a range between 0 and 30 volts DC or even higher. Accordingly, a low voltage device such as control circuit 110 running on 3 volts can initiate generation of a control voltage 145 much larger than 3 volts such as up to 30 volts or higher. No external high voltage power supply is required.

Control circuit 110 also generates mode selection signals 192 to configure transducer assembly 150. For example, in one embodiment, control circuit 110 chooses which of multiple transducers 180 on which to transmit or receive inductive signals. Control circuit 110 also can set transducer assembly 150 to a transmit mode and a receive mode. Control circuit 110 transmits or receives modulated signals via signal 195.

In one embodiment, the control circuit 110 tunes a selected transducer 180 (such as transducer 180-1) in the transducer assembly 150 to transmit or receive an inductive signal (e.g., a magnetic field) at a first carrier frequency based on initiation of the pulse generator circuit 125 to generate a first duration 139 of pulse 137. Following transmission of an inductive signal from the transducer 180 on the first carrier frequency, the control circuit 110 resets the control voltage 145 via reset signal 132 and re-tunes the transducer 180 in the transducer assembly 150 to receive or transmit an inductive signal on a second carrier frequency based on initiation by the control circuit 110 causing the control voltage generator 140 to generate a second duration 139 of pulse 137. A time required to electronically tune the transducer assembly 150 can range between 5 to 25 microseconds. In this way, transducer assembly 150 easily supports changing of communication modes in a short period of time.

As discussed above and according to one embodiment, generation of the pulse 137 by the pulse generator circuit 125 causes control voltage generator 140 to produce a control voltage 145 that tunes a transducer 180 in the transducer assembly 150. The control voltage generator 140 produces larger control voltages 145 for longer durations of pulses received from the pulse generator circuit 125. Consequently, a short duration 139 of pulse 137 produces a lower control voltage 145.

According to further embodiments, and as briefly discussed, the control circuit 110 includes a reset signal 132 to reset the control voltage 145 to zero to reset tuning of the transducer assembly 150. Consequently, the control circuit 110 can initially generate the control signal 130 to set the control voltage 145 and tune the transducer assembly 150 to a desired operating frequency. After the transmitting or receiving data on the transducer assembly 150, the control circuit 110 resets the control voltage 145 to substantially zero volts. Following a reset of the control voltage 145, the control circuit 110 can again initiate generation of another pulse of different pulse width 137 to produce a control voltage 145 to tune the transducer assembly 150 to another desired operating frequency. Accordingly, the control circuit 110 can initiate setting the transducer assembly 150 to different desired operating frequencies.

In one embodiment, the control circuit 110 initiates generation a pulse 137 in the control signal 130 to produce a control voltage 145 and tune a respective transducer circuit 180 (e.g., one of transducer circuit 180-1, transducer circuit 180-2, and transducer circuit 180-3) to a first carrier frequency and, thereafter, the control circuit 110 initiates generation of a reset signal 132 to reset the control voltage 145 prior to later re-tuning (e.g., via generation of another duration 139 of pulse 137) the transducer circuit 180 of the transducer assembly 150 to a different carrier frequency.

Although FIG. 1 illustrates multiple transducer circuits 160 and respective transducers 180, in one embodiment the transducer assembly 150 includes only a single transducer circuit 160 for tuning and transmission and/or reception of inductive signals.

In one embodiment, the control circuit 110 includes associated memory to store calibration information 120 including different pulse widths to be applied to the control voltage generator 140 for tuning a transducer circuit 180 in the transducer assembly to respective different operating frequencies. For example, after identifying a desired operating frequency for tuning the transducer assembly 150 and transmitting or receiving data, the control circuit 110 accesses the calibration information 120 in memory to identify the duration 139 of pulse 137 required to tune the transducer assembly 150 to the desired operating frequency.

Memory (e.g., on-chip or off-chip memory) associated with the control circuit 110 can store different calibration tables for respectively tuning the transducer assembly 150 depending on whether the control circuit 110 sets the transducer assembly 150 for transmitting or receiving. This is because a control voltage 145 for setting the transducer assembly 150 to a desired operating frequency for a transmit mode may not be the same as for a receive mode. For example, when in a transmit mode, setting the control voltage 145 to a given value sets the transducer assembly 150 to a first desired operating frequency for transmitting. However, switching the transducer assembly 150 to a receive mode and applying the same control voltage 145 to a respective transducer circuit 160 may result in tuning a given transducer to receive at an operating frequency different the first operating frequency due to a difference of parasitic impedances in the transducer circuit 160. That is, the parasitic impedances associated with a transmit mode and a receive mode of the transducer assembly 150 are different although the same control voltage 145 is used for tuning both circuits. Thus, according to one embodiment, to receive and transmit at the same operating frequency, the control circuit 110 generates two different sets of pulse durations 139 to produce respective control voltages 145 (at different times) so that the same transducer 180 in the transducer assembly 150 can both transmit and receive at the same operating frequency but for different cycles.

Accordingly, one embodiment of the transducer assembly 150 discussed above includes a tank circuit (e.g., transducer circuit 160) whose parasitic impedances change depending on whether a respective transducer 180 is set to a transmit mode versus a receive mode. Use of techniques discussed herein enable transmission and reception on the same transducer 180 without a significant delay between setting corresponding operational modes of the transducer 180.

According to one embodiment, the control circuit 110 maintains calibration information based on prior test measurements. For example, in a test mode, the control circuit 110 can tune the transducer assembly 150 (more specifically, each of transducers 180) through a range of tunings via application of different durations of pulse 137 while receiving a known test magnetic field signal from a test circuit within range of transducer assembly 150. Based on which applied pulse duration (or tuning) produces a strongest received signal for the received test magnetic field, the control circuit 110 stores this derived calibration information 120 in memory for later use.

A similar calibration routine can be used to calibrate the transducer assembly 150 for transmitting. In other words, the transducer assembly 150 can be tuned based on applying a range of different pulse durations while in a transmit mode. Test receiver equipment can be used to measure an inductive field signal generated by the transducer assembly 150 to identify an operating frequency of the transducer assembly 150 for the different tunings. Associated calibration information derived from the test is stored as calibration information 120. Consequently, based on the above calibration testing, the control circuit 110 associated with the transducer assembly 150 can identify respective operating frequencies of each respective transducer circuit 160 in the transducer 150 assembly for the different applied pulse durations and respective control voltage values.

Figure 2:
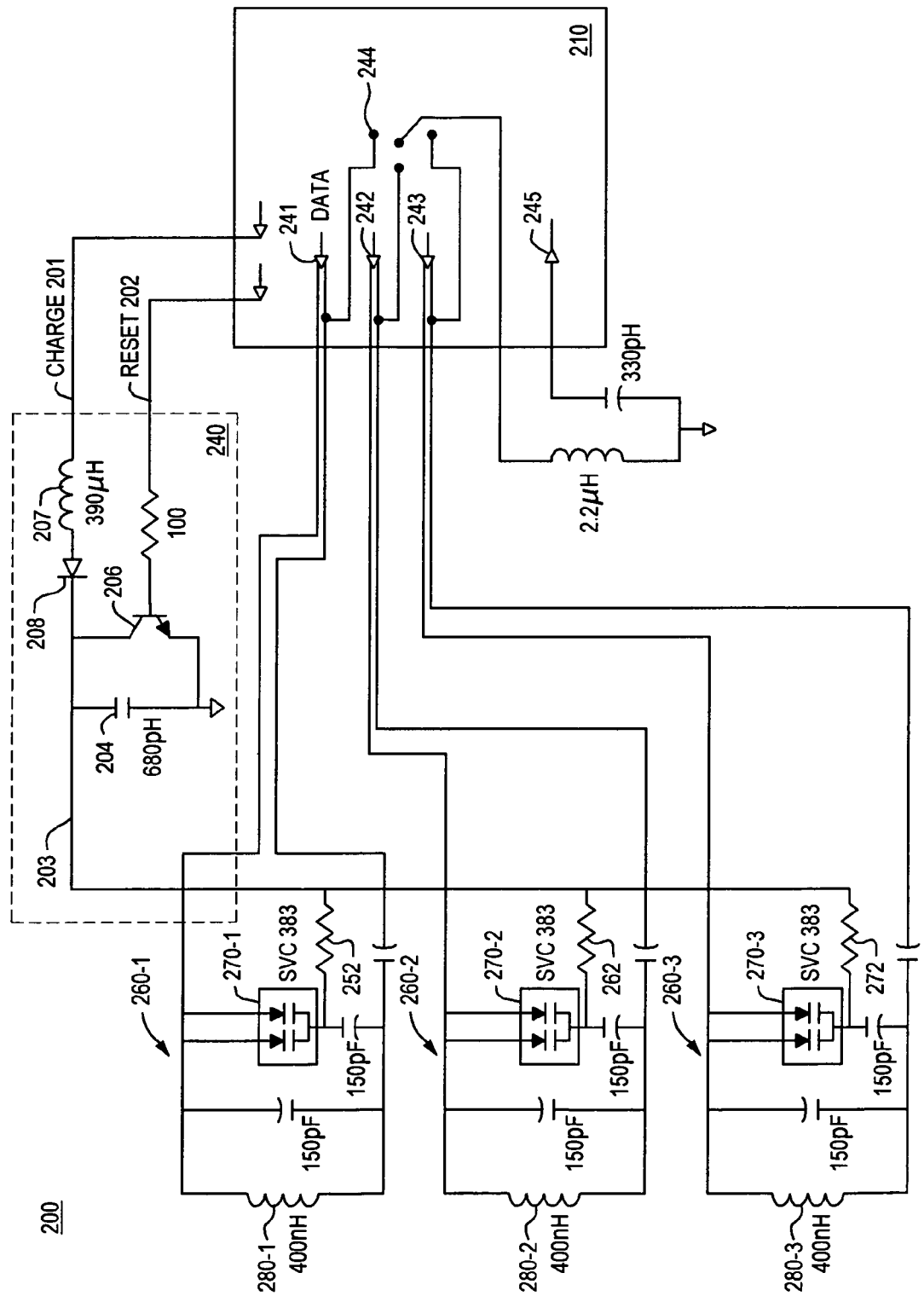
FIG. 2 is a schematic diagram of a tuning circuit according to an embodiment of the invention.

In another embodiment, calibration of the transducer assembly 150 can take place in the field during usage of the devices for magnetic communications. For example, while a magnetic communication device A (e.g., an MP3 player) is transmitting to a magnetic communication device B (e.g., wireless headphones) under a static set of operating conditions (i.e., the devices are not moving relative to each other or movement is averaged over a long measurement period, thus making the magnetic field at the receiver constant), device B may tune its receiver via application of different durations of pulse 137 and determining if the current pulse width 139 should be changed to a new pulse width 139 in order to maximize the received signal. In a similar manner, device A's transmitter may be tuned in the field by having device B measure the received signal for different pulse widths 139 of device A and, by communicating with device A to determine the pulse width 139 in device A which results in the strongest transmitted signal at a selected frequency. In this manner, devices in the field can be "self-tuning" to adjust to changes in environmental conditions, component values within the devices, differences in operating frequencies between devices, and other such system operating conditions. Self tuning is also described in earlier filed U.S. patent application Ser. No. 10/004,989 entitled "Wireless Communication Over a Transducer Device," filed on Dec. 3, 2001, which has been incorporated herein by reference. FIG. 2 is a circuit diagram illustrating an electronically tunable communication system 200 according to an embodiment of the invention. As shown, communication system 200 includes a control circuit 210, a control voltage generator 240, and respective transducer circuits 260-1, 260-2, and 260-3.

In the example embodiment shown, control voltage generator 240 is a high voltage pulse circuit that provides a control voltage 203 (e.g., tuning voltage) which is applied to tune varactors 270-1, 270-2, and 270-3. In one embodiment, the transducer circuits 280 are driven by differential drivers 241, 242, and 243 such as those in a CMOS mixed signal transceiver circuit in control circuit 210, which also generates a modulated signal to be applied to each of the drivers 241, 242, and 243 to produce a modulated magnetic field. Control circuit 210 delivers maximum power to produce a respective modulated magnetic field signal when using differential type drivers 241, 242, and 243, although single ended type drivers may also be used.

CMOS circuits typically have input/output signal specifications less than 5 volts. In general, use of more advanced and fine line width processes during fabrication of the circuits results in a lower circuit operating voltage. Certain CMOS devices run off 3 volts or less voltage sources. In contrast, varactors 270 generally require higher voltages for tuning, such as up to 30 volts for a Sanyo™ SVC383 as shown. An advantage of using a high voltage pulse circuit (e.g., control voltage generator 240) is that the pulse circuit including inductor 207 can generate a voltage higher than the output voltage of a CMOS mixed signal transceiver such as control circuit 210 without the use of an external high voltage power supply.

Another advantage of communications system 200 is that a simple circuit (e.g., control voltage generator 240) under control of a CMOS mixed signal transceiver control circuit 210 can initiate generation of control voltage 203 (or, as previously discussed, control voltage 145).

The control voltage 203 drives each of the three varactors 270-1, 270-2, and 270-3. Thus, multiple transducer circuits 260 share use of the same control voltage 203. Note that other embodiments of communication system 200 can include a separate control voltage generator 240 for each of the transducer circuits 280 rather than a single control voltage generator that is shared.

Since the pulse width of the CHARGE signal 201 determines the applied DC control voltage 203 to the varactors 270-1, 270-2, 270-3 as discussed above (i.e., the control voltage 203 applied to the varactors determines the capacitance of the varactors), storing the digital representation of the pulse width in control circuit 210 enables the control circuit to tune each transducer 280-1, 280-2, and 280-3. Furthermore, different pulse widths values for each of the different transducers 280 (in either receive or transmit mode) and corresponding operating frequencies can be stored in the control circuit 210. In one embodiment, a pulse width "table" associated with control circuit 210 provides a tuning map for different operating conditions. Such a table may further include adjustment information that allows tuning and compensation to be performed in real-time in the field during use of the communication system 200. For example, six values may be stored for a three transducer system, three settings for each transducer during a transmit mode and three settings for each transducer when switched to a receive mode. Additional information may be stored to compensate for temperature variations, different transmit frequencies, different receive frequencies, and other such settings depending on environmental or operational conditions.

The operation of communication system 200 is as follows. Tuning occurs by applying a control voltage 203 through the 27K resistors 252, 262 and 272 to bias the varactors 270-1, 270-2, and 270-3 respectively. In one embodiment, only one transducer 280 is activated at a time by control circuit 210, which selects the appropriate transceiver driver 241, 242, and 243 on which to drive a modulated signal for transmission over a respective transducer 280 as a magnetic field signal. Control circuit 210 selects different operational modes (e.g., which transducer 280 on which to receive a magnetic field) via setting of switch 244. For example, receiver 245 receives a modulated signal depending on a setting of switch 244.

In one embodiment, a magnitude of the control voltage 203 generated by the control voltage generator 240 is greater than a voltage magnitude of the pulse 137 in the CHARGE signal 201 received from the pulse generator circuit 125 (or control circuit 210). For example, the voltage magnitude of the pulse can be 3 volts (for a logic high portion of the pulse 137) while the magnitude of the control voltage 203 is up to 30 volts or more. Thus, in one embodiment as in FIG. 1, the voltage magnitude of the pulse 137 generated by the pulse generator circuit 125 is less than 4 volts and the magnitude of the control voltage 145 is greater than 6 volts.

Figure 3:
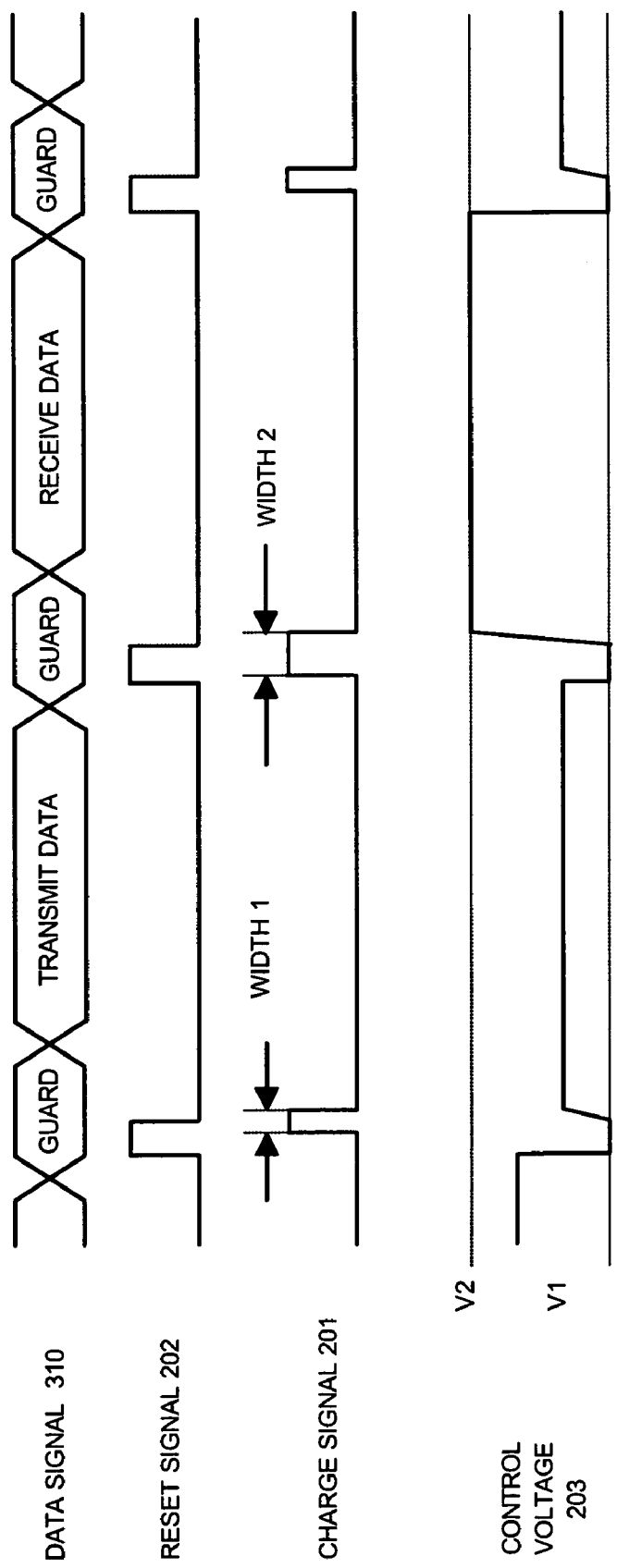
FIG. 3 is a timing diagram illustrating signals for tuning according to an embodiment of the invention.

FIG. 3 is a timing diagram for operating communication system 200 according to an embodiment of the present invention. As shown, timing diagram illustrates a data signal 310, a reset signal 202, a charge signal 201 (e.g., a control signal), and a control voltage 203.

Prior to transmission of data during a time slot (e.g., during the first shown GUARD period), control circuit 210 generates reset signal 202 to temporarily activate transistor 206 and reset control voltage 203 on capacitor 204 to zero volts. Thereafter, control circuit 210 generates a CHARGE signal 201 (e.g., a pulse of WIDTH 1) and the reset signal 202 is deactivated to enable charge to accumulate on capacitor 204. Application of the CHARGE signal 201 to inductor 207 and deactivation of the reset signal 202 results in producing a control voltage 203 to a predetermined voltage value as determined by the duration of the applied pulse (e.g., WIDTH 1). Thus, when the reset signal 202 is active, transistor 206 turns on causing current to flow through inductor 207. While a charge signal 201 is still applied, control circuit 210 opens transistor 206 by setting reset signal 202 low again. Current continues to flow through inductor 207, charging control voltage 203 to an appropriate voltage (which can be up to 30 or more volts). As discussed, application of the control voltage 203 to the varactors 270 tunes one of the respective transducers 280 for transmitting or receiving data.

In one embodiment, the control circuit 210 varies the leading edge (e.g., rising edge) of the CHARGE signal 201 relative to the corresponding falling edge to change a value of generated control voltage 203. For example, applying a logic high voltage on charge signal 201 for a longer duration (e.g., WIDTH 2 is greater than WIDTH 1) while transistor 206 is active results in more current flowing through inductor 207. When switching the transistor 206 off, a greater control voltage 203 is produced for WIDTH 2 due to the higher current through inductor 207 for this case. In other embodiments, the falling edge of the CHARGE signal 201 is adjusted to impact a value of the control voltage 203. Also, the rising and falling edges of the RESET signal 202 can be adjusted to vary a value of the control voltage 203.

After applying the CHARGE signal 201 to generate the control voltage 203 to a voltage V1, control circuit 210 initiates transmitting data from a respectively tuned transducer 280 during TRANSMIT DATA period. Diode 208 prevents energy in capacitor 204 from leaking back through the control circuit 210. In other words, the control voltage remains constant during the TRANSMIT DATA period. Control circuit 210 excites a tuned transducer 280 by applying a modulated signal via respective one or more output drivers 241, 242 or 243.

After transmitting data during a TRANSMIT DATA cycle, control circuit 210 generates a RESET pulse 202 and thereafter applies a different pulse width (e.g., WIDTH 2) in the CHARGE signal 201 to generate a control voltage 203 of V2 to tune a transducer for receiving data during RECEIVE DATA cycle.

Referring again to FIG. 2, control circuit 210 performs selection of a transducer 280 for receiving based on use of the three-to-one T/R switch 244. In one embodiment, and as discussed above, a different pulse width is used to tune a selected transducer 280 depending on whether it is set to a transmit or receive mode. This is because parasitics of the circuit change depending a setting of the drivers 241, 242, and 243 and the T/R (transmit/receive) switch 244. Thus, an advantage of communication system 200 is that such a circuit topology easily compensates for parasitic circuit differences.

The predetermined pulse widths of CHARGE signal 201 can be calculated during a calibration or tuning cycle as discussed. The method involves selecting a transducer 280, its operating mode (transmit or receive), and its operating frequency. Through an iterative process, an on-chip microprocessor associated with the control circuit 210 generates a series of increasingly longer pulse widths that are applied to the control voltage generator 240 via application of the CHARGE signal 201. A separate circuit from the transducer assembly 150 generates a test magnetic field signal at a given operating frequency. The transducer assembly 150 receives the test magnetic field on one or more transducers 280. The control circuit 210 measures a feedback portion of this test magnetic field signal that effectively represents the tuning state of the transducer. The pulse width that results in the largest fed back test signal is retained in memory as the tuning value for that particular test setting.

Control circuit 210 can generate a tuning table by repeating this method for different transducers, modes and environmental conditions, and operating frequencies. During normal operation values from this table are accessed and implemented to dynamically tune the communication system 200 under varying operating conditions.

In one application, transducer assembly operates in a TDD (Time Division Duplex) system that can be configured to alternately transmit and receive in synchronization with a base transceiver unit. During a transmit frame, driver 241, 242, and 243 are selectively activated (to control power output levels) and to apply a GMSK modulated square wave to transducers 280 and related circuitry.

Figure 4:
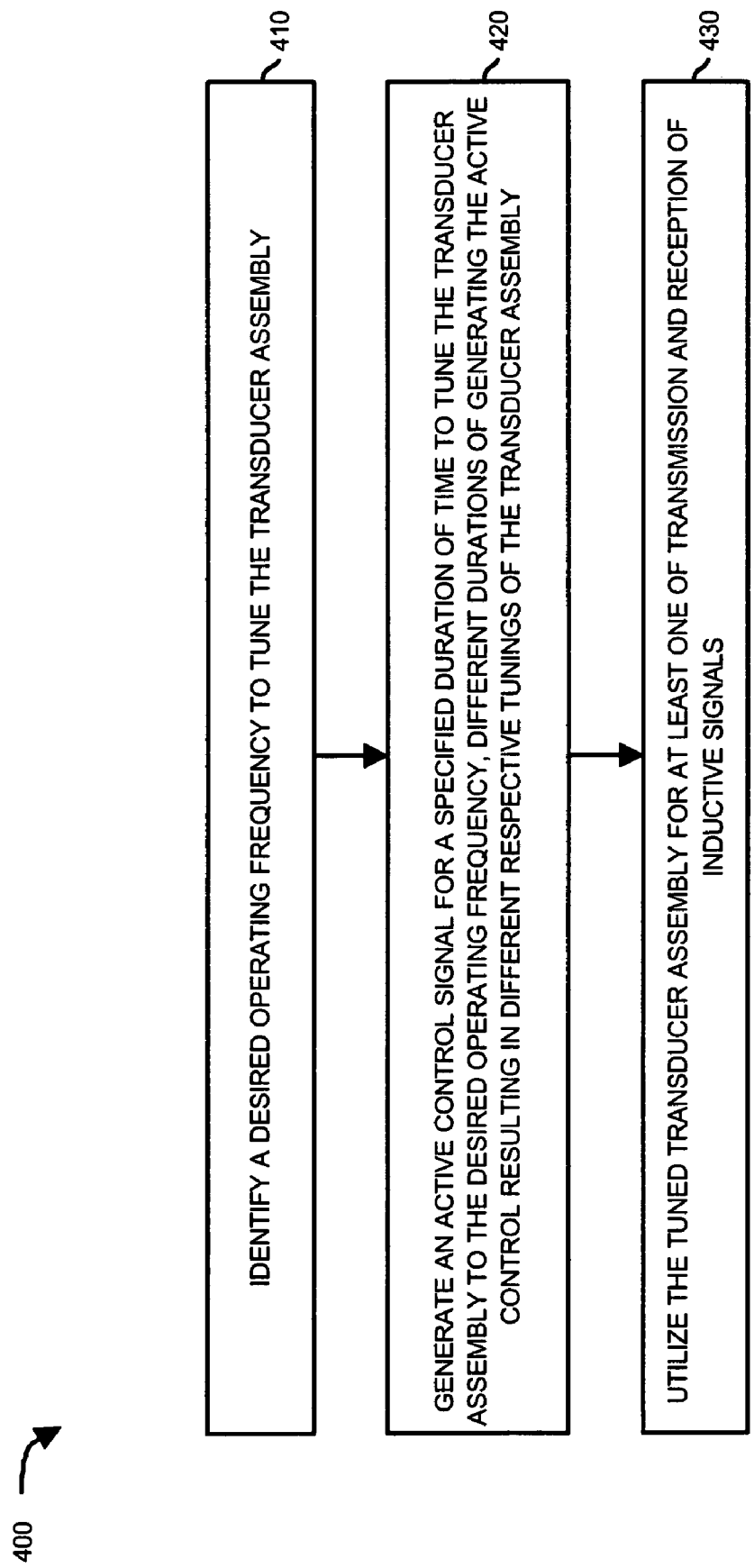
FIG. 4 is a flowchart illustrating a technique according to an embodiment of the invention.

In view of the above-mentioned embodiments, FIG. 4 is a flowchart 400 illustrating a technique of electronically tuning a transducer according to an embodiment of the invention.

In step 410, the control circuit 110 identifies a desired operating frequency, mode, and transducer to tune in the transducer assembly 150.

In step 420, the control circuit 110 initiates generation of an active control signal (e.g., a charge phase or a time in which application of the control signal causes a change to a produced control voltage 145) for a specified duration 139 of time to tune the transducer assembly 150 to the desired operating frequency. Different durations of generating the active control result in different respective tunings of the transducer assembly 150 as previously discussed.

In step 430, the control circuit 110 utilizes the tuned transducer assembly for at least one of transmission and reception of inductive signals. For example, in a transmit mode, the control circuit 110 modulates a data signal onto a carrier frequency to which the transducer assembly 150 is tuned. In a receive mode, the control circuit 110 receives a modulated data signal based on a carrier frequency to which the transducer assembly 150 is tuned.

Embodiments of the invention are well-suited for use in shorter-range wireless applications such as those that support inductive or magnetic coupling, but the broader general concepts discussed herein can be extended to other applications as well. For example, the technique of generating pulses can be used to adjust attributes of other types of electronic circuitry.

While this invention has been particularly shown and described with references to preferred embodiments thereof, it will be understood by those skilled in the art that various changes in form and details may be made therein without departing from the spirit and scope of the invention as defined by the appended claims. As such, the foregoing description of embodiments of the invention is not intended to be limiting.

What is claimed is:

1. A method of electronically tuning a transducer assembly, the method comprising:
generating a first control signal for a respective first duration of time to tune the transducer assembly to a first operating frequency; and
utilizing the transducer assembly tuned to the first operating frequency for at least one of transmission and reception of inductive signals;
storing calibration information for tuning a transducer in the transducer assembly to the first operating frequency, which is selected from a set of multiple different possible operating frequencies; and
utilizing the calibration information to identify attributes of a respective control signal required to tune the transducer assembly to the first operating frequency.

2. A method as in claim 1 further comprising: following use of the transducer assembly at the first operating frequency:
generating a second control signal for a respective second duration of time to tune the transducer assembly to a second operating frequency; and
utilizing the transducer assembly tuned to the second operating frequency for at least one of transmission and reception of inductive signals.

3. A method as in claim 2 further comprising:
selecting the first operating frequency and the second operating frequency to avoid interference with other wireless devices.

4. A method as in claim 1 further comprising:
selecting a given transducer circuit of multiple transducer circuits in the transducer assembly for tuning to the first operating frequency, the given transducer circuit including a respective transducer on which to at least one of receive and transmit the inductive signals; and
wherein generating the first control signal includes generating the first control signal to include a pulse whose duration at least in part determines tuning of the given transducer circuit.

5. A method as in claim 4, wherein tuning the given transducer circuit includes:
utilizing the pulse in the first control signal to generate a respective control voltage; and
applying the respective control voltage to a circuit component of the given transducer circuit to tune the respective transducer to the first operating frequency, an impedance of the circuit component and respective tuning of the given transducer circuit changing depending on a magnitude of the respective control voltage applied to the circuit component.

6. A method as in claim 4, wherein generating the pulse in the control signal produces a control voltage that tunes the given transducer circuit in the transducer assembly to operate at the first operating frequency, a magnitude of the control voltage being greater than a respective voltage amplitude associated with the pulse in the control signal.

7. A method as in claim 1 further comprising:
selecting the first operating frequency to avoid interference with other wireless devices.

8. An apparatus comprising:
a transducer assembly including at least one transducer that supports at least one of transmission and reception of inductive signals;
a control circuit that generates a first control signal at a first voltage level;
a voltage generator circuit that generates, based on characteristics of the first control signal, a second control signal at a second voltage level for tuning the transducer assembly to a desired operating frequency; and
wherein a respective voltage amplitude of the second control signal is greater than a supply voltage used to power the control circuit, which is fabricated using CMOS technology.

9. An apparatus as in claim 8, wherein a respective voltage amplitude of the second control signal is greater than a respective voltage amplitude of the first control signal.

10. An apparatus as in claim 8, wherein the first control signal includes at least two successive pulses.

11. An apparatus as in claim 8, wherein the transducer assembly includes multiple transducer circuits, the control circuit selecting a given transducer circuit of multiple transducer circuits in the transducer assembly for tuning, the given transducer circuit including a respective transducer element on which to at least one of receive and transmit the inductive signals.

12. An apparatus as in claim 11, wherein the control circuit has access to calibration information indicating respective values associated with the first control signal for tuning the respective transducer element in the given transducer circuit to different operating frequencies, the control circuit accessing the calibration information to identify a respective setting of the first control signal to be used to tune the respective transducer element in the given transducer circuit to the desired operating frequency.

13. An apparatus as in claim 8, wherein the voltage generator circuit applies the second control signal to a capacitive circuit component of the transducer assembly to tune a respective transducer in the transducer assembly to the desired operating frequency, an impedance of the capacitive circuit component changing depending on a voltage magnitude of the second control signal.

14. An apparatus as in claim 13, wherein the capacitive circuit component is a varactor device whose impedance varies depending on a magnitude of the second control signal, the impedance of the capacitive circuit component being used to tune the respective transducer to the desired operating frequency.

15. A method comprising steps of:
enabling a transducer element in a respective transducer assembly to receive a magnetic field;
generating multiple different control signals to vary an impedance of a varactor device and tune the transducer element to receive on different respective operating frequencies, the multiple different control signals including pulses, a respective duration of the pulses tuning the transducer element for receiving the magnetic field;
identifying which of the multiple different control signals is optimal for receiving the magnetic field; and
storing an identified optimal control signal value for later use.

16. An apparatus comprising:
a transducer assembly including at least one transducer that supports at least one of transmission and reception of inductive signals;
a control circuit that generates a first control signal at a first voltage level;
a voltage generator circuit that generates, based on characteristics of the first control signal, a second control signal at a second voltage level for tuning the transducer assembly to a desired operating frequency;
wherein the transducer assembly includes multiple transducer circuits, the control circuit selecting a given transducer circuit of multiple transducer circuits in the transducer assembly for tuning, the given transducer circuit including a respective transducer element on which to at least one of receive and transmit the inductive signals; and
wherein the control circuit has access to calibration information indicating respective values associated with the first control signal for tuning the respective transducer element in the given transducer circuit to different operating frequencies, the control circuit accessing the calibration information to identify a respective setting of the first control signal to be used to tune the respective transducer element in the given transducer circuit to the desired operating frequency.

* * * * *